(12) United States Patent
Dangelmaier et al.

(10) Patent No.: US 7,838,989 B2
(45) Date of Patent: Nov. 23, 2010

(54) SEMICONDUCTOR COMPONENT AND APPARATUS FOR PRODUCTION OF A SEMICONDUCTOR COMPONENT

(75) Inventors: Jochen Dangelmaier, Beratzhausen (DE); Mario Engl, Unterhaching (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 759 days.

(21) Appl. No.: 11/635,827

(22) Filed: Dec. 8, 2006

(65) Prior Publication Data
US 2007/0158860 A1    Jul. 12, 2007

(30) Foreign Application Priority Data
Dec. 23, 2005   (DE) .................. 10 2005 062 344

(51) Int. Cl.
H01L 23/34    (2006.01)
(52) U.S. Cl. ............... 257/728; 257/676; 257/666; 361/813; 361/805; 361/806; 361/808
(58) Field of Classification Search ........... 257/666, 257/676, 728; 361/813, 805, 806, 808
See application file for complete search history.

(56) References Cited

U.S. PATENT DOCUMENTS

| | | | |
|---|---|---|---|
| 4,827,327 A | | 5/1989 | Miyauchi et al. |
| 5,075,759 A | * | 12/1991 | Moline ................ 257/692 |
| 5,200,362 A | * | 4/1993 | Lin et al. ................ 29/841 |
| 6,507,100 B1 | * | 1/2003 | Valluri et al. ........... 257/697 |
| 6,583,365 B2 | * | 6/2003 | Chang ................. 174/260 |
| 6,646,339 B1 | | 11/2003 | Ku et al. |
| 6,828,661 B2 | * | 12/2004 | Araki et al. ........... 257/676 |
| 2003/0076666 A1 | * | 4/2003 | Daeche et al. .......... 361/813 |
| 2003/0179549 A1 | * | 9/2003 | Zhong et al. .......... 361/707 |

(Continued)

FOREIGN PATENT DOCUMENTS

DE    103 36 171    2/2005

(Continued)

OTHER PUBLICATIONS

Tanaka et al., A 76-77 GHz High Isolation GaAs PIN-Diode Switch MMIC, R&D Review of Toyota CRDL, vol. 37, No. 2, pp. 19-26, May 2002.

(Continued)

*Primary Examiner*—Mary Wilczewski
*Assistant Examiner*—Telly D Green
(74) *Attorney, Agent, or Firm*—Dicke, Billig & Czaja, PLLC

(57) ABSTRACT

A semiconductor component for radio-frequency applications has at least one substrate and one chip, and with contact pads is disclosed. In one embodiment, bonding wires connect the contact pads on the chip to the contact connecting pads. Signals are passed via these contact pads such that signals at high frequencies are passed via one or more contact pads and signals at low frequencies are passed via one or more contact pads. The chip is shifted on the substrate from a central position with respect to the totality of the contact connecting pads, so that the bonding wires for those contact pads via which signals at a high frequency are passed are shorter than bonding wires for those contact pads via which signals at low frequencies are passed.

21 Claims, 13 Drawing Sheets

U.S. PATENT DOCUMENTS

2004/0262039 A1\* 12/2004 Taggart et al. .............. 174/262
2005/0104166 A1 5/2005 Ichikawa
2006/0038265 A1\* 2/2006 Oberlin et al. .............. 257/676
2007/0013051 A1 1/2007 Heyan et al.

FOREIGN PATENT DOCUMENTS

| | | |
|---|---|---|
| JP | 60010651 | 1/1985 |
| JP | 2005235885 | 9/2005 |
| WO | 2005015632 | 2/2005 |

OTHER PUBLICATIONS

Gresham et al., A Compact Manufacturable 76-77-GHz Radar Module for Commercial ACC Applications, IEEE Transactions on Microwave Theory and Techniques, Jan. 2001, vol. 49, No. 1, pp. 44-58.
Klein et al., Au/Sn-Flip-Chip-Bonding Fur 77 GHz-Radar-Frontend-Anwendung, VTE aus Forschung and Technologie, 2005, pp. 1-6.

\* cited by examiner

SEMICONDUCTOR COMPONENT AND APPARATUS FOR PRODUCTION OF A SEMICONDUCTOR COMPONENT

CROSS-REFERENCE TO RELATED APPLICATIONS

This Utility Patent Application claims priority to German Patent Application No. DE 10 2005 062 344.1 filed on Dec. 23, 2005, which is incorporated herein by reference.

BACKGROUND

The invention relates to a semiconductor component, and to a method for production of a semiconductor component. In the case of semiconductor components which operate at very high frequencies, parasitic inductances on the lines which connect the chip that is located in the semiconductor component to the external contacts of the semiconductor component often lead to signal interference.

These inductances can be reduced by using flip-chip technology for connection of the chip which is located in the semiconductor component. By way of example, "Au/Sn-Flip-Flop-Bonding für 77 GHz-Radar-Frontend-Anwendung", PLUS (Produktion von Leiterplatten und Systemen) [Gold/Tin Flip-Chip Bonding for 77 GHz Radar Frontend application], [Production of printed circuit boards and systems], No. 5/2005, pages 914-919 by M. Klein, M. Hutter and H. Oppermann discloses a 77 GHz chip for a proximity radar in automobiles, in which the flip-chip contacts are produced by means of an improved soldering process. However, heat that is produced in the chip is dissipated relatively poorly when flip-chip mounting such as this is used.

"A Compact Manufacturable 76-77 GHz Radar Module for Commercial ACC Applications", IEEE Transactions on Microwave Theory and Techniques, Vol. 49, No. 1 by I. Gesham et al. in contrast discloses a chip which is mounted using bonding wires for a 77 GHz radar. The parasitic inductances of the bonding wires are calculated, and are taken into account in the design of the connecting lines for the module. A simulation such as this and in particular the subsequent design process are complex and must be carried out by the manufacturer of each assembly which contains a semiconductor component such as this.

For these and other reasons there is a need for the present invention.

SUMMARY

One embodiment provides a semiconductor component for radio-frequency applications has at least one substrate and one chip, and with contact pads. In one embodiment, bonding wires connect the contact pads on the chip to the contact connecting pads. Signals are passed via these contact pads such that signals at high frequencies are passed via one or more contact pads and signals at low frequencies are passed via one or more contact pads. The chip is shifted on the substrate from a central position with respect to the totality of the contact connecting pads, so that the bonding wires for those contact pads via which signals at a high frequency are passed are shorter than bonding wires for those contact pads via which signals at low frequencies are passed.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention will be explained in more detail with reference to one exemplary embodiment, in the drawings, in which:

FIGS. 17 and 18 illustrate an isometric illustration and a side view of a model for a semiconductor component according to the second embodiment.

DETAILED DESCRIPTION

Figure 1:
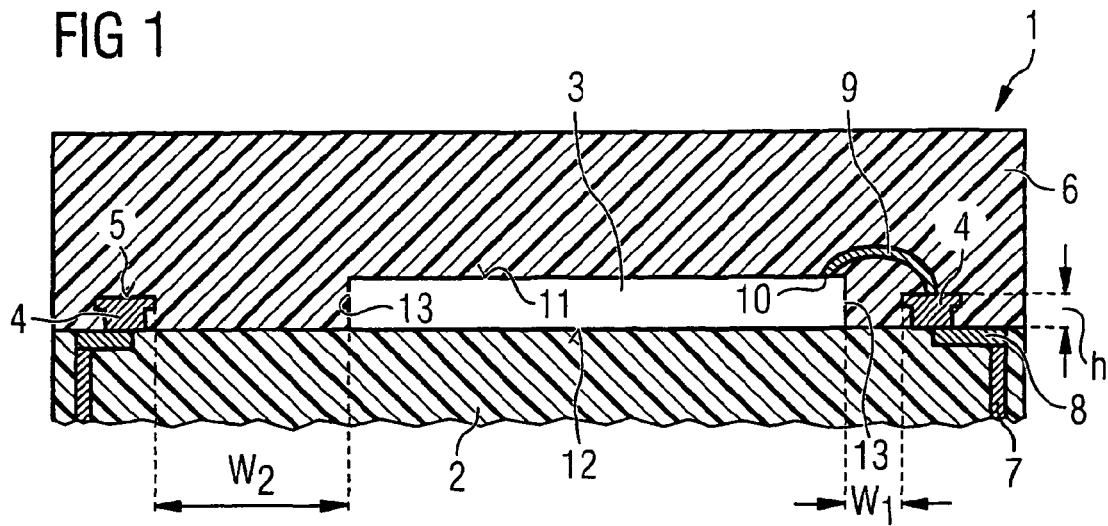
FIG. 1 illustrates a semiconductor component for radio-frequency applications, in a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back,"

"leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor component having a chip for radio-frequency applications, in which good heat dissipation from the chip to the surrounding area is possible, and which can easily be installed in an assembly. Another embodiment provides a method for a semiconductor component such as this.

According to one embodiment, a semiconductor component for radio-frequency applications is provided, which has at least one chip with an upper face and a rear face. The chip has contact pads on the upper face. The semiconductor component also has a substrate, to which the chip is fitted such that the rear face of the chip faces the substrate. Contact connections with contact connecting pads are located on the upper face of the substrate. Bonding wires connect the contact pad on the chip to the contact connecting pads. The contact pads differ in terms of the frequency of the signals which are passed via these contact pads, so that signals at high frequencies are passed via some of the contact pads, and signals at low frequencies are passed via other contact pads.

The chip is arranged between the contact connecting pads on the substrate such that it is shifted from the center of the totality of the contact outer surface. The chip is thus located closer to a first set of contact connecting pads than to a second set of contact connecting pads.

Signals at high frequencies are passed via contact connecting pads in the first set, while signals at low frequencies are passed via contact connecting pads in the second group. The high frequencies are in this case at least one and a half times as high as the low frequencies. Corresponding to the contact connecting pads, there are also a first set of contact pads and a second set of contact pads which differ in terms of the frequencies which are passed via the contact pads. A set may also comprise only a single contact connecting pad or contact pad. The bonding wires for those contact pads via which signals at high frequencies are passed are in this case shorter than the bonding wires for those contact pads via which signals at low frequencies are passed. In consequence, the inductances for the bonding wires with high frequencies are lower than the inductances for signals at low frequencies. For signals at low frequencies, the inductance is generally not as critical, since the inductive interference decreases as the frequency falls.

Radio-frequency components, such as a 77 GHz VCO, for example, are operated with signals, and/or drive signals at different frequencies between 2.4 GHz and 77 GHz. The signals at the relatively low frequencies of 2.4 GHz are passed via the long bonding wires, while the length of the bonding wires for the high frequencies at 77 GHz is shortened by shifting the chip from a central position.

If a die pad is fitted to the substrate and the chip is located on this die pad, the rear face of the chip can be connected, for example, to the ground potential. This die pad, also referred to as a chip island, is in this case composed of metal in order to make it possible to produce an electrical connection to the rear face of the chip.

In this embodiment, the die pad is preferably no higher than 60 μm, in order to allow good heat dissipation from the chip to the substrates.

In one embodiment of the invention, the contact connecting pad is higher than the height of the die pad. For this purpose, the die pad and the contact connection are be implemented in two different processes, but this also results in a shorter bonding wire length between the contact pad and the contact connecting pad. The height of the contact connecting pad is preferably chosen such that it is located at the same height as the contact pad on the chip. This additionally shortens the bonding wire length.

According to the invention, the chip can be shifted such that one of its faces ends flush with the side edge of the die pad which is located under it. The side edge of the die pad can thus advantageously be used for adjustment of the chip during installation. This means that distances between the chip and the contact connecting pads may be less than 200 μm. If the chip projects at the side over one side edge of the die pad, this distance can be reduced to values which are less than 50 μm.

If the chips rests directly on the substrate, the height of the semiconductor component, on the one hand, can be reduced. On the other hand, it is possible to ensure improved heat dissipation from the chip directly to the substrate. This heat conduction is particularly good if the substrate has a copper plate, onto which the rear face of the chip is soldered, at least on its upper face.

The contact connections on their upper face are preferably coated with an electrochemically deposited layer.

The greater the difference between the high and low frequencies, the greater are the advantages of the invention. Its advantages are particularly evident when the high frequencies are at least 2.5 times higher than the low frequencies, and even more if this factor is 3.5. If the high frequencies are in the Gigahertz range, the inductive interference is particularly critical and it is particularly worthwhile arranging the chip according to the invention.

The semiconductor component according to the invention is particularly suitable for a 77 GHz oscillator for a radar as is installed, for example, in an automobile. In the case of a component such as this, possible inductive interference and poor heat dissipation as a result of the high frequency are particularly critical. A semiconductor component such as this has a P-TSLP housing.

According to one embodiment, a method is also provided for production of a semiconductor component, with which a substrate with contact connections is first of all provided. These contact connections have contact connecting pads on their upper face. A chip with an upper face and a rear face and with contact pads on its upper face is fitted to the substrate. In this embodiment, the rear face of the chip is located between the contact connecting pads on the substrate such that the chip is shifted from a central position with respect to the totality of the contact connecting pads. The bonding wires for those contact pads via which signals at a high frequency are passed are shorter than the bonding wires for contact pads via which signals at low frequencies are passed. The high frequencies are in this case at least one and a half times as high as the low frequencies. The short bonding wires result in lower inductances and thus less inductive interference than on the signals at a high frequency.

In one embodiment, a die pad composed of metal is fitted to the substrate before the chip is fitted, on which die pad the chip is in turn placed. Ground connections to the rear face of the chip and to contact pads on the upper face of the chip can be produced via this die pad.

In another embodiment, the substrate has an upper face composed of copper, and the chip is soldered directly onto the substrate. A lack of the die pad reduces the overall height of the semiconductor component, thus allowing a more compact shape. In a corresponding manner, it is also possible to design the contact connections not to be as high. The contact connections also make a contribution to the inductive interference. This contribution is reduced by shorter contact connections. The chip is preferably ground thin before being fitted to the substrate or to the die pad, in order to reduce the chip height. A housing height of 100 to 150 µm is thus possible.

In one embodiment, the chip is fitted such that it projects at the side over one side edge of the die pad, thus making it possible to additionally reduce the length of the bonding wire which transmits a high-frequency signal.

The contact pads are preferably located at the same height as the contact connecting pads. This likewise serves to shorten the bonding wire lengths.

FIG. 1 illustrates a schematic cross section through a radio-frequency semiconductor component according to a first embodiment of the invention. A semiconductor component 1 contains a substrate 2, to which a chip 3 is fitted. In addition, contact connections 4 with contact connecting pads 5 are fitted to the upper face of the substrate 2. The chip 3 and the contact connections 4 are surrounded by a housing compound 6, for example composed of a resin. Vias 7 are fitted for connection of the contact connections to external contacts of the semiconductor component 1, and are electrically connected to the contact connections 4 by means of a wiring layer 8.

External contacts 10 are fitted to the upper face 11 of the semiconductor chip 3. These external contacts 10 are connected via bonding wires 9 to the contact connecting pads 5. In the exemplary embodiment illustrated here, the rear face 12 of the chip 3 rests directly on the substrate 2 and is connected to the substrate 2 via a soldered joint.

In order to illustrate the overall relationships in this figure, which is not illustrated to scale, the distances are illustrated between the side edges 13 of the chip and the external contacts 4. A distance $w_1$ of 200 µm is shown on the right-hand side. However, the distance may also be reduced to values between 50 and 150 µm. The distance $w_2$ is illustrated on the left-hand side and in the chosen example is 1 mm.

The asymmetric arrangement of the chip 3 results in a short distance between the contact pad 10 on the right-hand side and the contact connecting pad 5 on the right-hand side. In consequence, the bonding wire 9 is short, thus greatly reducing the self-inductance of the bonding wire 9 in comparison to a symmetrical arrangement.

The height of the contact connection is annotated h and, in the standard case, is 50 µm, with a maximum of 75 µm. The provision of the chip directly on the substrate allows a thin housing to be produced, with a height of 100 µm to 150 µm. For this purpose, it is advantageous to grind the chip thin down to 50 µm to 60 µm, in order to ensure that the height is as identical as possible to that of the contact connection.

Figure 2:
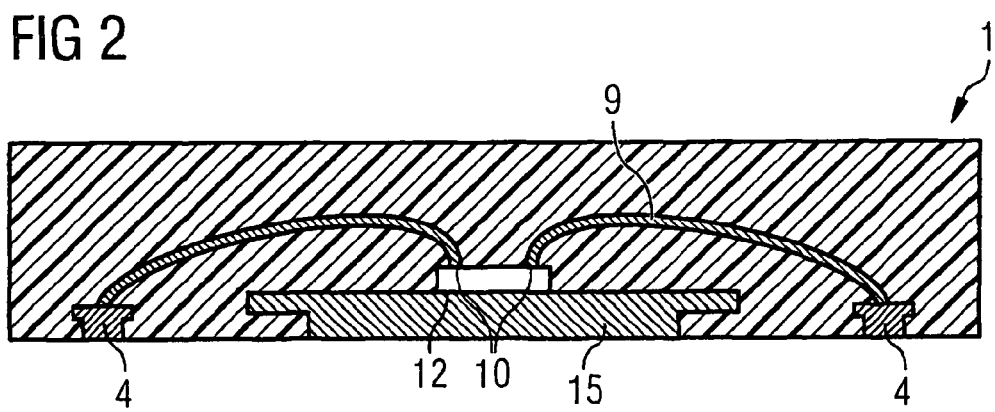
FIG. 2 illustrates a cross section through a conventional semiconductor component.

FIG. 2 illustrates a conventional semiconductor component 1 in which the chip 3 is located in the center between the right-hand and left-hand contact connections 4. Elements with the same functions as in the previous figures are annotated with the same reference symbols, and will not be explained again. In contrast to the first embodiment illustrated in FIG. 1, the chip is not located directly on the substrate, but is located on a die pad 15 which in this case is formed from metal. This die pad 15 rests on a substrate which is not illustrated in FIG. 2.

Figure 3:
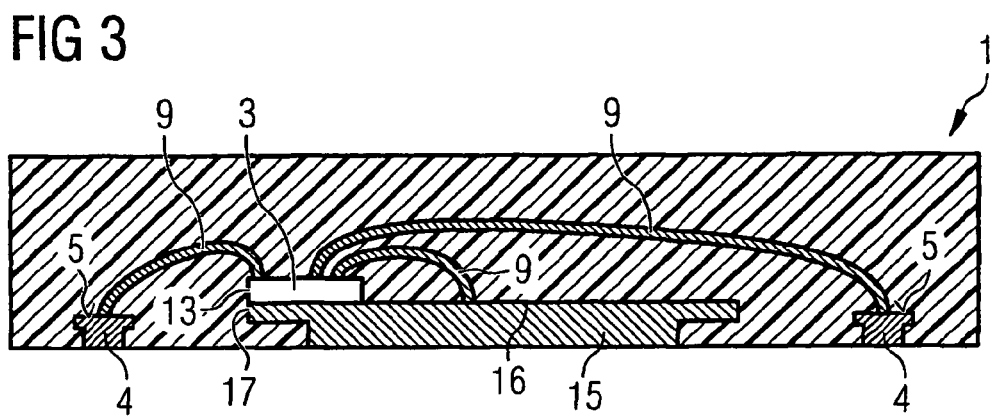
FIG. 3 illustrates a cross section through a semiconductor component in a second embodiment of the invention.

FIG. 3 illustrates a semiconductor component 1 according to the invention, according to a second embodiment. In this case, the chip is fitted to a die pad 15 such that the left-hand side edge 13 is flush with the left-hand side edge 17 of the die pad 15. The bonding wires 9 for the left-hand contact connecting pads 5 are thus considerably shorter than the bonding wires 9 for the right-hand contact connecting pads 5.

One of the bonding wires connects one contact connection 10 on the right-hand side of the chip 3 to the upper face 16 of the die pad 15. This is particularly suitable for embodiments in which the die pad 15 is composed of metal and is fitted to a conductive substrate 2 composed of copper. A ground potential connection can thus be passed via the substrate 2, and the die pad 15 via the bonding wire 9, to a contact pad 10 on the chip 3. This bonding wire 9 is short, so that the inductance and the resistance are kept low. Particularly for the ground connection, it is desirable for the supply to be as free of interference as possible, since any interference with the ground potential for the chip 3 influences all of the circuits on the chip 3.

Figure 4:
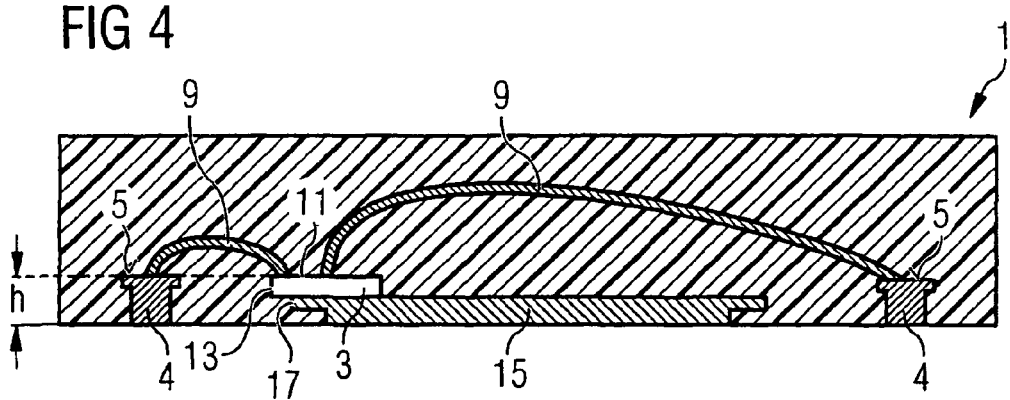
FIG. 4 illustrates a cross section through a semiconductor component in a third embodiment of the invention.

A radio-frequency semiconductor component 1 according to a third embodiment is illustrated schematically in FIG. 4. In this case, the chip 3 is fitted to the die pad 15 in such a manner that it projects over the left-hand side of the die pad 15. The side edge 13 of the chip 3 is located further to the left than the left-hand side edge of the die pad 15.

The die pad 15 is lower than the contact connections 4, so that the upper face 11 of the chip 3 is at the same height as the contact connecting pads 5. This height is annotated h, and can be kept small by the die pad 15 being manufactured only from a thin metal layer, and by the chip 3 being ground thin before being fitted to the die pad. The fact that the contact pads 10 and the contact connecting pad 5 are at the same height h additionally reduces the length of the bonding wires 9, thus also reducing the inductive interference caused by the bonding wires 9.

In this embodiment as well, as also in the other embodiments which have a die pad 15, the die pad 15 can be directly connected to a contact pad 10 on the chip 3 via a bonding wire 9. This option is not shown in FIG. 4.

Figure 5:
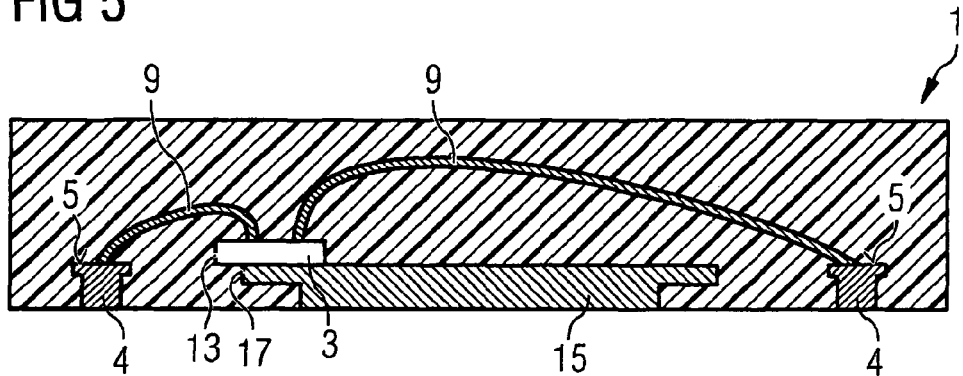
FIG. 5 illustrates a cross section through a semiconductor component in a fourth embodiment.

FIG. 5 illustrates a fifth embodiment of the invention. In this embodiment, the chip 3 projects at the side over the die pad 15. The left-hand side edge 13 of the chip 3 is thus located to the left of the left-hand side edge 17 of the die pad 15.

Figure 6:
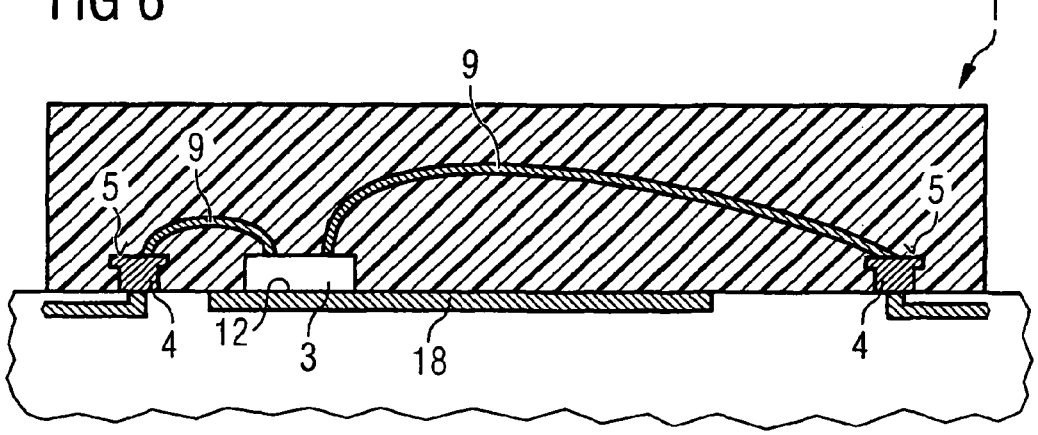
FIG. 6 illustrates a cross section through a semiconductor component in a fifth embodiment.

FIG. 6 illustrates a schematic illustration of a fifth embodiment of the radio-frequency semiconductor component according to the invention, in which the chip 3 is fitted directly to a substrate 2. In this case, the rear face 12 is soldered directly onto a copper plate 18, which is located on the upper face of the substrate 2. The copper plate 18 is also used to dissipate heat from the chip 3. The direct contact between the rear face 12 and the copper plate 18 results in particularly good heat conduction. The lack of the die pad 15 also reduces the height at which contact pads 10 on the chip 3 are located. In this embodiment, this height corresponds to the height of the contact connecting pads 5. As stated above, this additionally reduces the length of the bonding wires 9.

Figure 7:
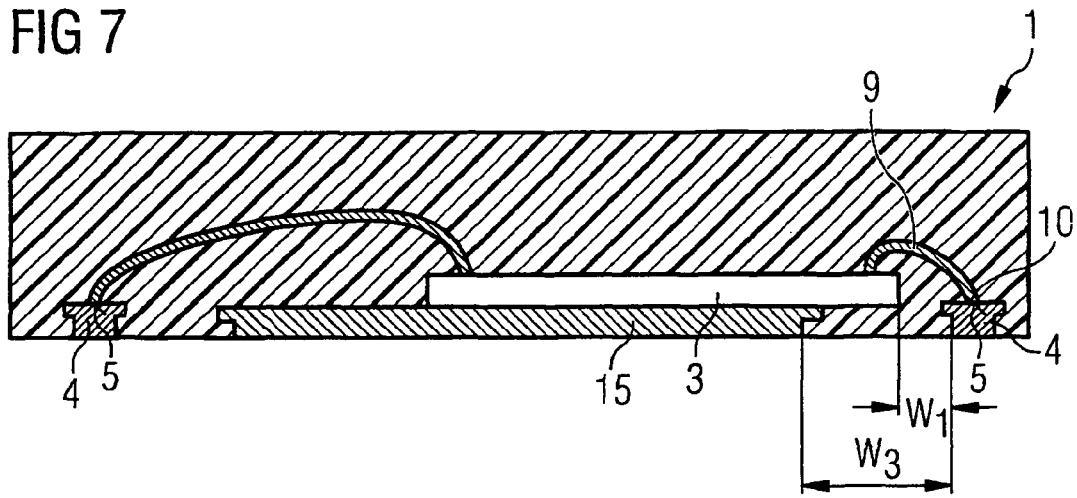
FIG. 7 illustrates a cross section through one variant of the fourth embodiment.

FIG. 7 illustrates the distances between contact connections 4 to the chip 3 and the die pad 15 according to a fourth embodiment of the invention. The distance $w_1$ between the chip 3 and the contact connection 4 is 50 µm, whereas the distance $w_3$ between the die pad 15 and the contact connection 4 is a minimum of 150 µm. The projection of the chip 3 results in the right-hand bonding wire 9 on the right-hand side having a short length. The heat dissipation is good, because of the small height of the die pad 15. However, the contact connection 4 and the die pad 15 have to be produced in different process steps, because of their different heights, for example by being produced in two etching process steps. However, the corresponding phototechnical process steps must also be carried out twice for this purpose.

Figure 8:
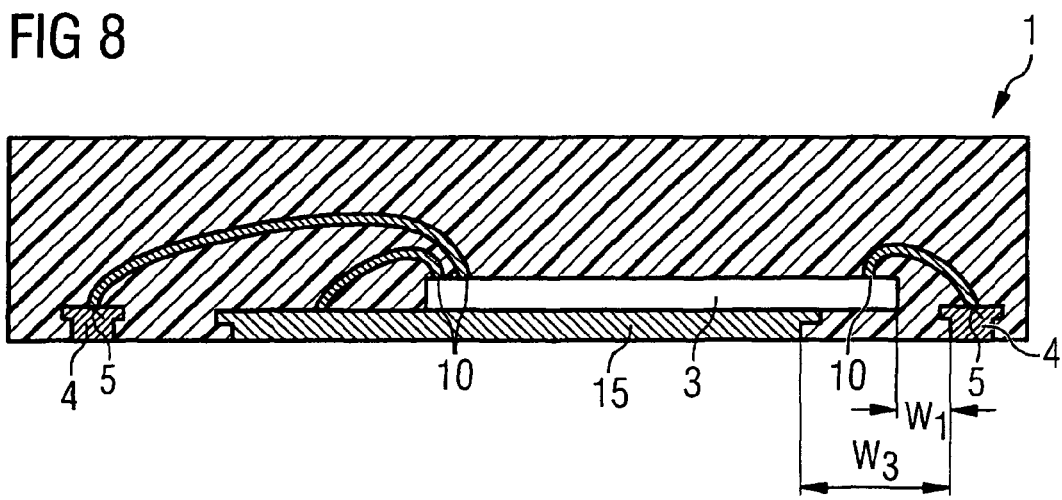
FIG. 8 illustrates a variant of the third embodiment of the invention.

FIG. 8 illustrates the distances between the chip 3, the die pad 15 and the contact connection 4 for a radio-frequency component 1 according to the third embodiment. The distance $w_1$ is once again 50 μm, whereas the distance $w_3$ is 200 μm. In this case, the contact connections 4 can be produced in the same process steps as the die pad 15. It is thus possible to use a standard mounting process, for example, TSLP mounting, but in which the chip is offset. Once again, this results in a short bonding wire length. In the example illustrated in FIG. 8, the die pad 15 is connected to ground. The rear face 12 of the chip 3 is thus also at ground, which is advantageous for some applications. In order to improve the ground supply to the chip 3, a bonding wire 9 is passed from the die pad 15 to a contact pad 10 on the chip 3, as shown in FIG. 3.

Figure 9:
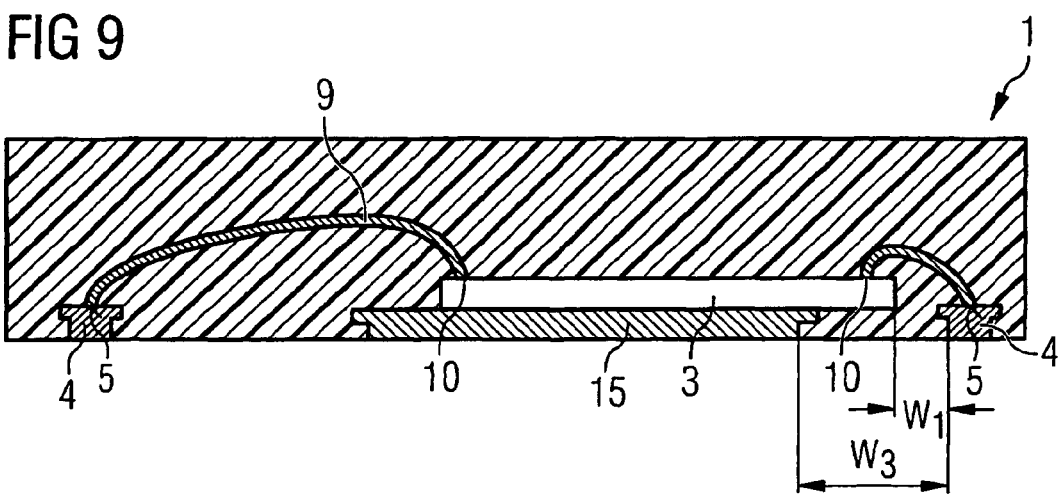
FIG. 9 illustrates a cross section through a further variant of the third embodiment.

This connection is no longer present in FIG. 9. It has thus been possible to make the die pad 15 smaller, which reduces the size of the housing of the radio-frequency component 1.

The left-hand contact connection 4 may either be as high as the die pad 15, as illustrated in FIG. 7, or may be as high as the right-hand contact connection 4. The distances $w_1$ and $w_2$ are of precisely the same size as in the exemplary embodiment illustrated in FIG. 8.

Figure 10:
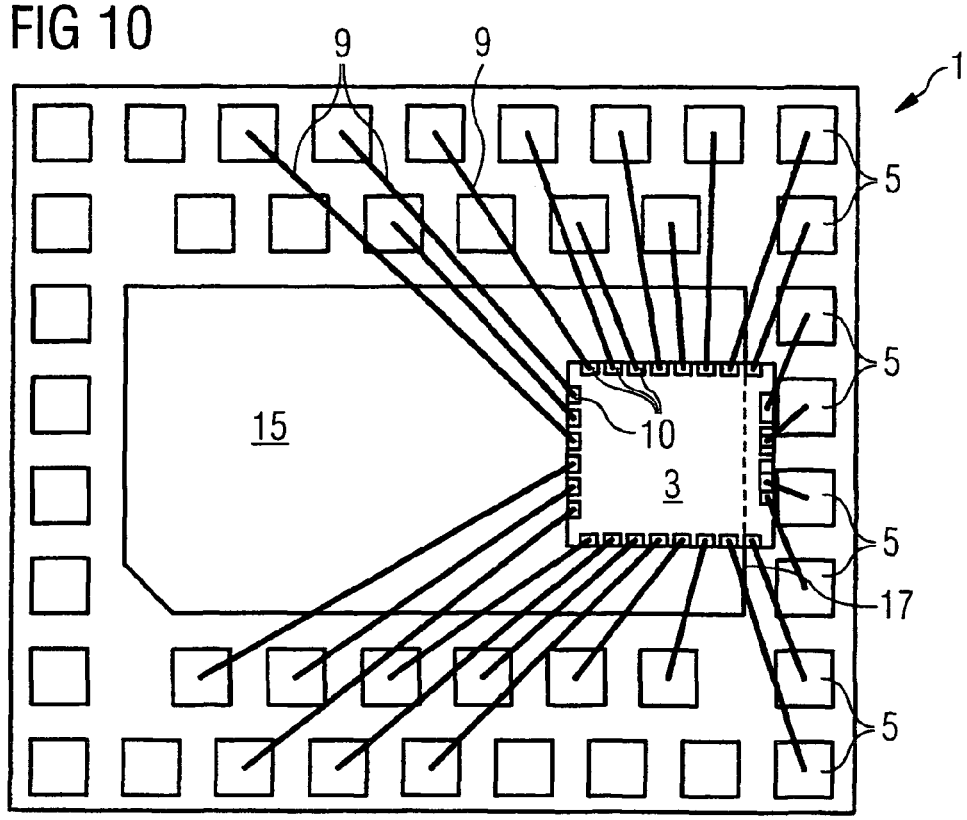
FIG. 10 illustrates a plan view of a semiconductor component according to the invention.

FIG. 10 illustrates a plan view of one exemplary embodiment of a radio-frequency component 1 according to the invention. In this case, the chip 3 projects on the right-hand side over the side edge 17 of the die pad 15. This results in the bonding wires 9 which run between the contact pads 10 and the contact connecting pads 5 having different line lengths.

Figure 11:
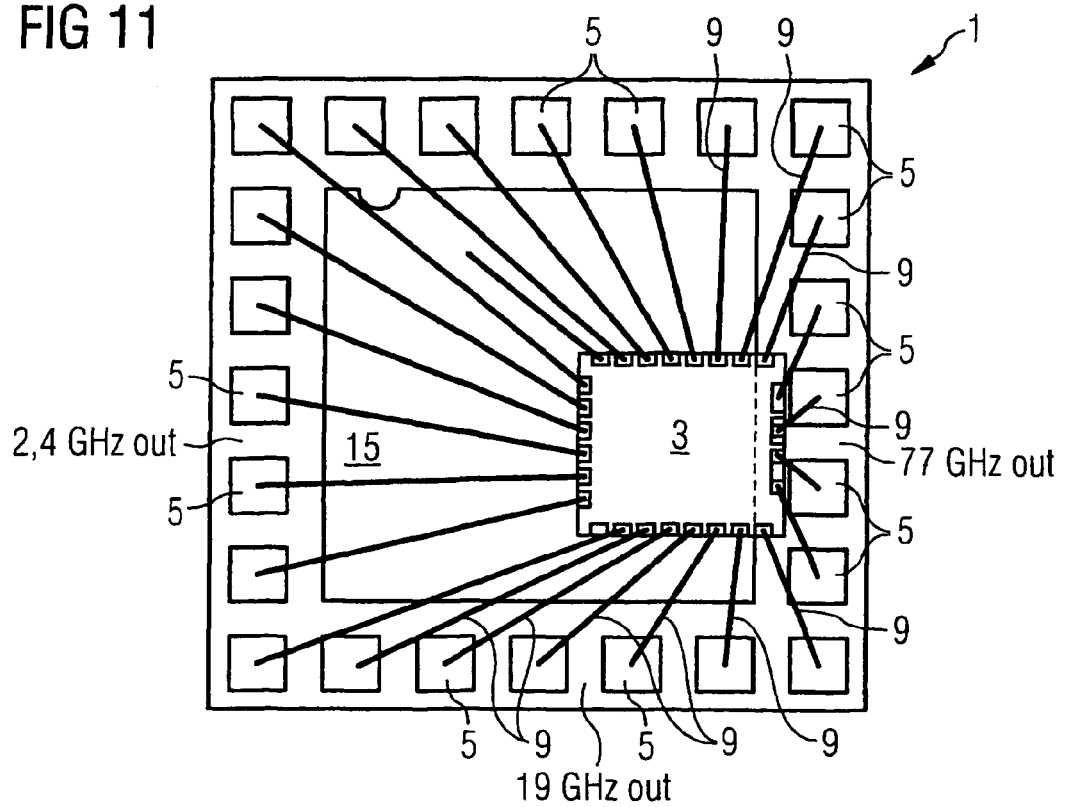
FIG. 11 illustrates a detail from FIG. 10.

FIG. 11 likewise illustrates a plan view of one embodiment of a radio-frequency semiconductor component 1 according to the invention. In contrast to the exemplary embodiment illustrated in FIG. 10, one of the bonding wires 9 is also connected to the upper face of the die pad 15. FIG. 11 additionally illustrates the frequency of those signals which are passed via the corresponding bonding wires 9. The two central bonding wires on the right-hand side carry signals at 77 GHz. Signals at frequencies of 19 GHz are passed via the bonding wires 9 on the lower face. Bonding wires 9, which are long in comparison to the bonding wires 9 on the right-hand side, are located on the left-hand side. Signals at 2.4 GHz, for example, are transmitted on the left-hand side. The stated frequencies are in each case frequencies of output signals from the chip 3. The two contact pads on the right-hand side belong to a first set of contact pads, while the signals in the lower area and in the left-hand area belong to a second set. The frequencies for the first set are more than 3.5 times higher than all of the frequencies in the second set. The minimum of the frequencies in the first set and the maximum of the frequencies in the second set are used for calculation of the factor. In this case, the bonding wires for supply lines, for example ground supply lines, whose frequency is zero or close to zero are ignored.

The chip 3 can be fitted directly to the copper by adhesive bonding if there is no need to metallize the rear face of the chip. If the rear face of the chip is metallized, the chip 3 can also be mounted on the copper plate 18 by gold/tin soldering, eutectically by gold/arsenic soldering, or by soldering with a high lead content. In order to simplify the mounting of the chip 3, it is recommended that the rear face 18 of the chip 3 be coated with a metal layer before the adhesive bonding or soldering process.

In order to assess the suitability of the radio-frequency components, the scatter parameters of the bonding wires 9 were simulated by one conventional and three embodiments of a radio-frequency component according to the invention. These are in each case components with TSLP-24 housings, in which the contact connections 4 and the die pad 15 each have a height of 50 μm.

Figure 12:
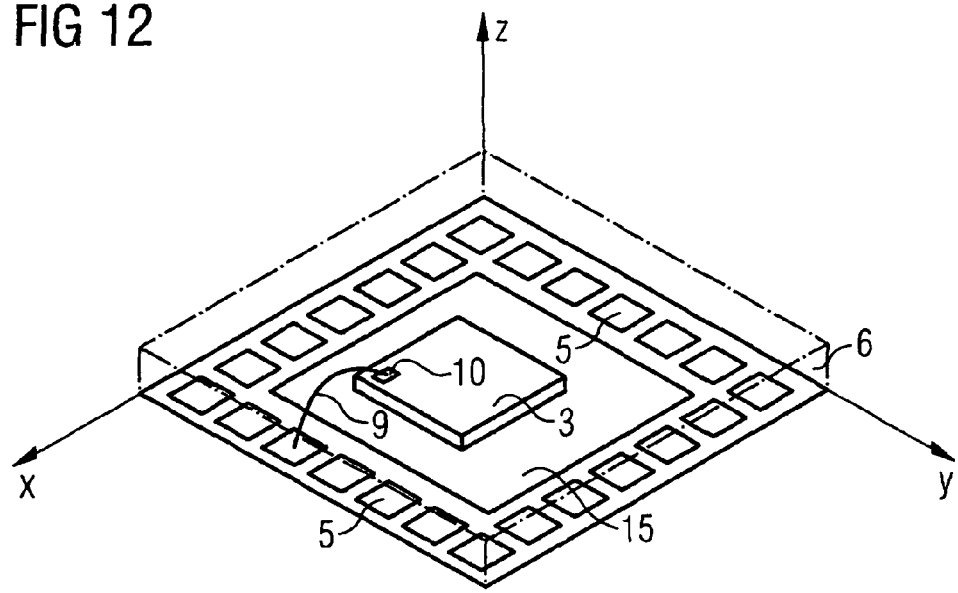
FIG. 12 illustrates an isometric illustration of a model of a semiconductor component as is used for the simulation.
Figure 13:
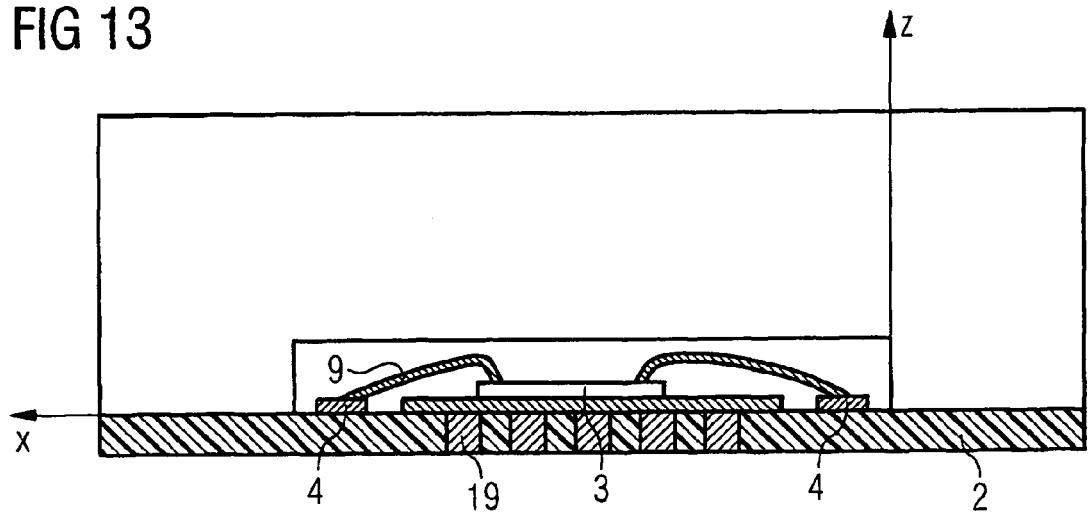
FIG. 13 illustrates a side view of the model shown in FIG. 12.
Figure 14:
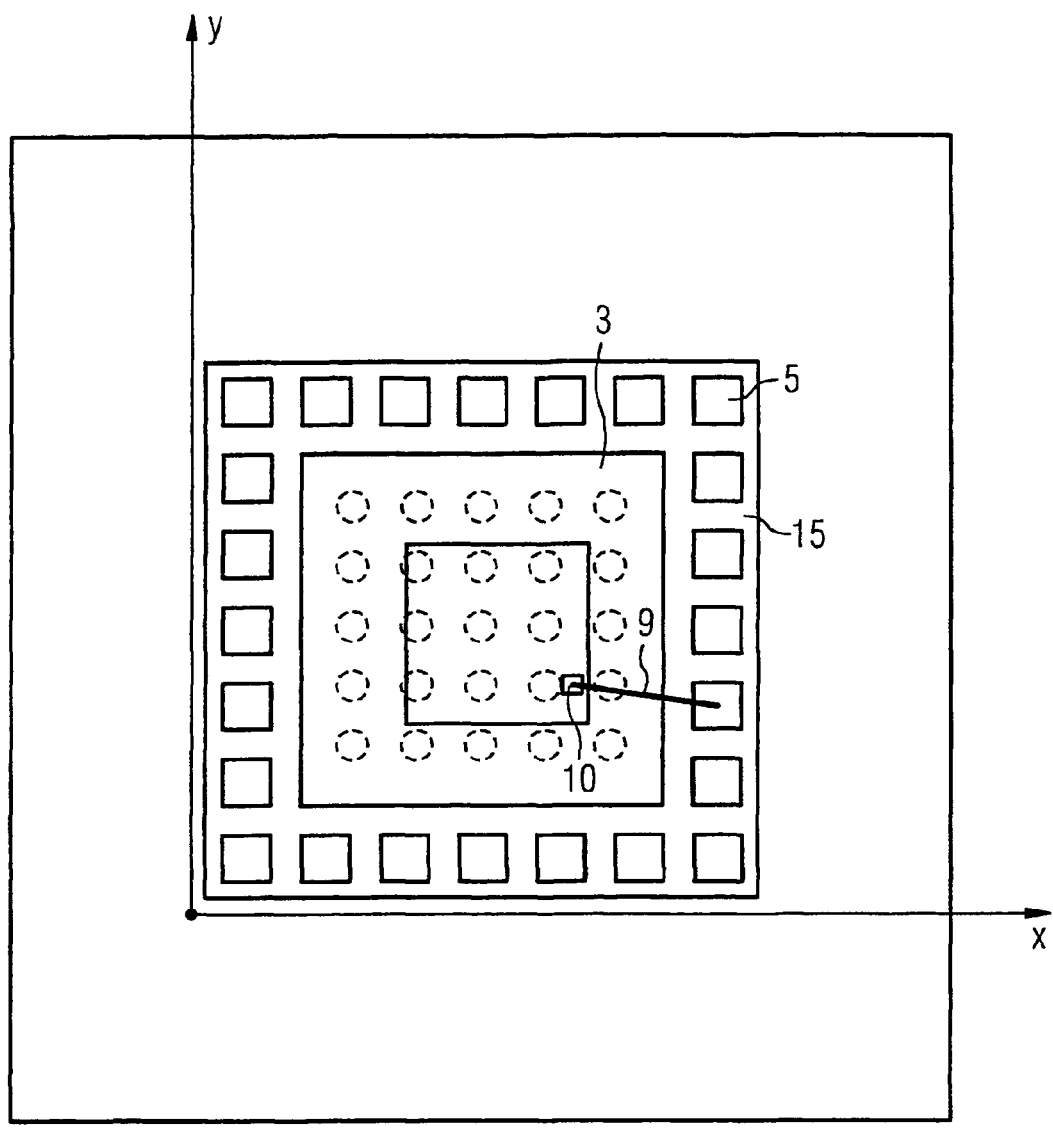
FIG. 14 illustrates a plan view of the model shown in FIG. 12.

The dimensions of the bonding wires were determined by the creation of a graphic model, on the basis of which the dimensions were calculated. FIG. 12 illustrates an isometric view of the general model, FIG. 13 shows a side view of it, and FIG. 14 illustrates a plan view of it. In addition to the known elements of the semiconductor component, copper pins 19, which ensure heat dissipation in the substrate 2, are illustrated in FIG. 13.

Figure 15:
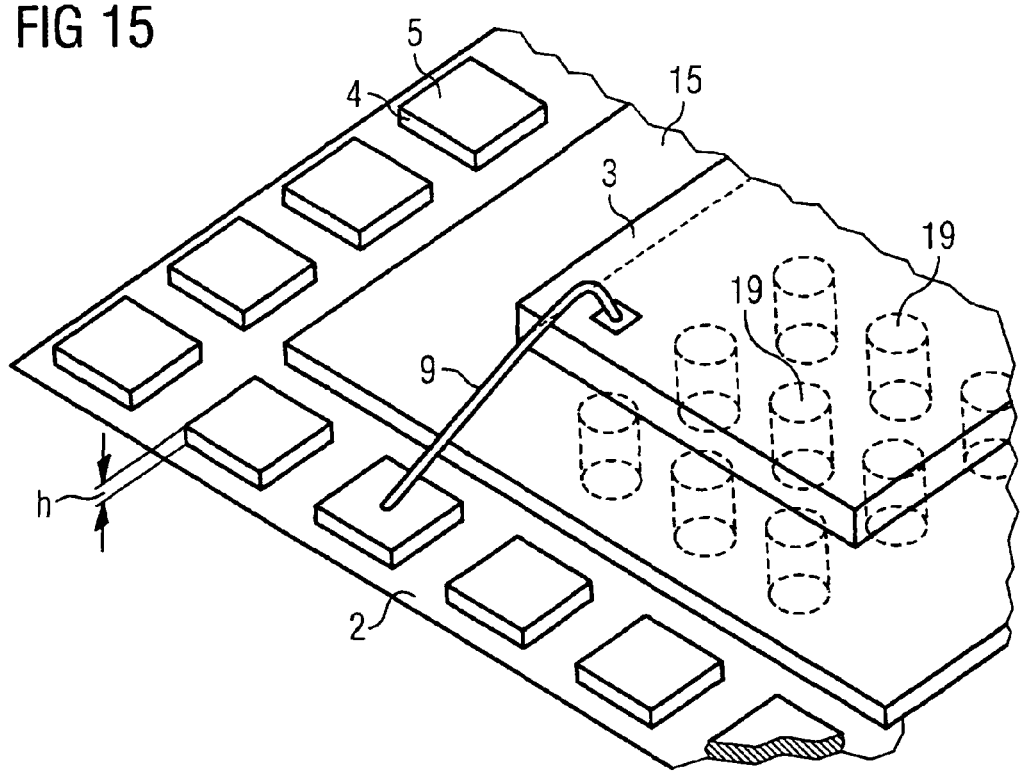
FIG. 15 illustrates a detail from the model shown in FIG. 12, illustrated isometrically.
Figure 16:
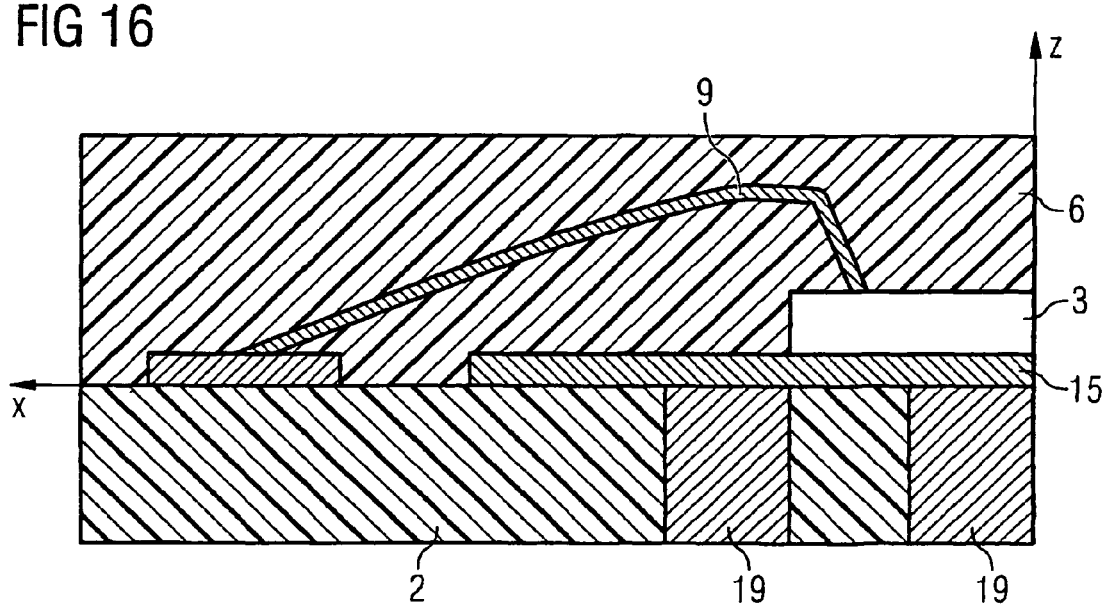
FIGS. 16 and 17 illustrate a side view as well as an isometric illustration of a model for a conventional component.

Discrepancies from the general model can be seen in the subsequent FIGS. 15 to 22. FIG. 15 and FIG. 16 illustrate details from a standard radio-frequency component with a TSLP-24 housing, with the height h of the contact connection 4 and of the die pad 15 being 50 μm.

Figure 17:
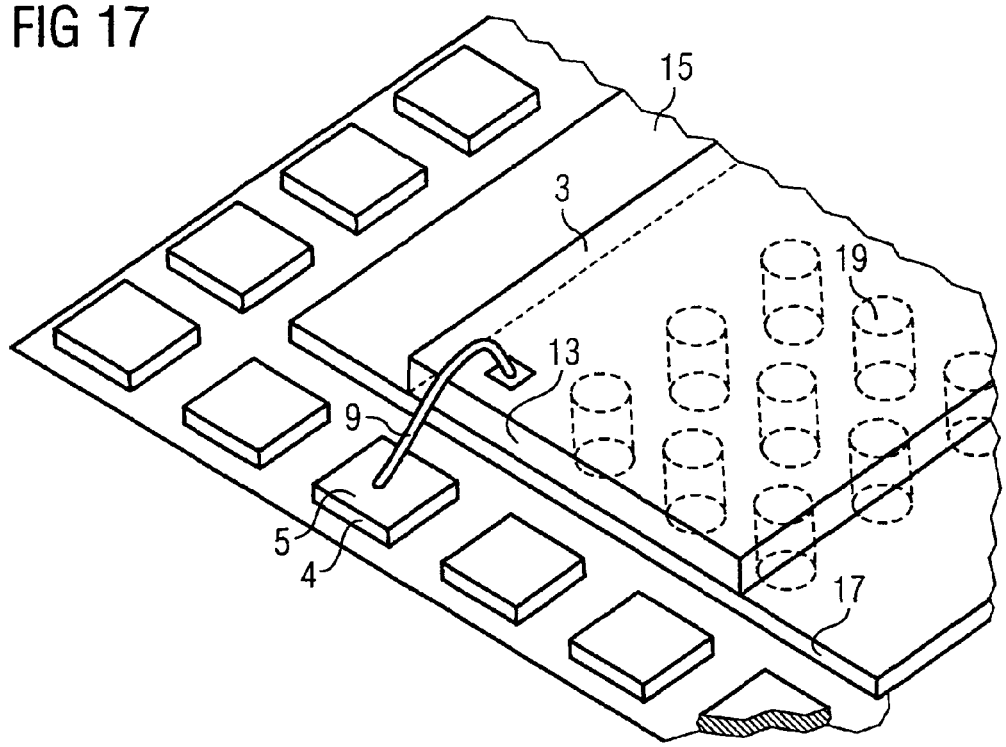

FIG. 17 illustrates an isometric illustration of a detail of a radio-frequency semiconductor component 1 according to the second embodiment. In this case, the side edge 13 of the chip 3 is flush with the side edge 17 of the die pad 15.

Figure 18:
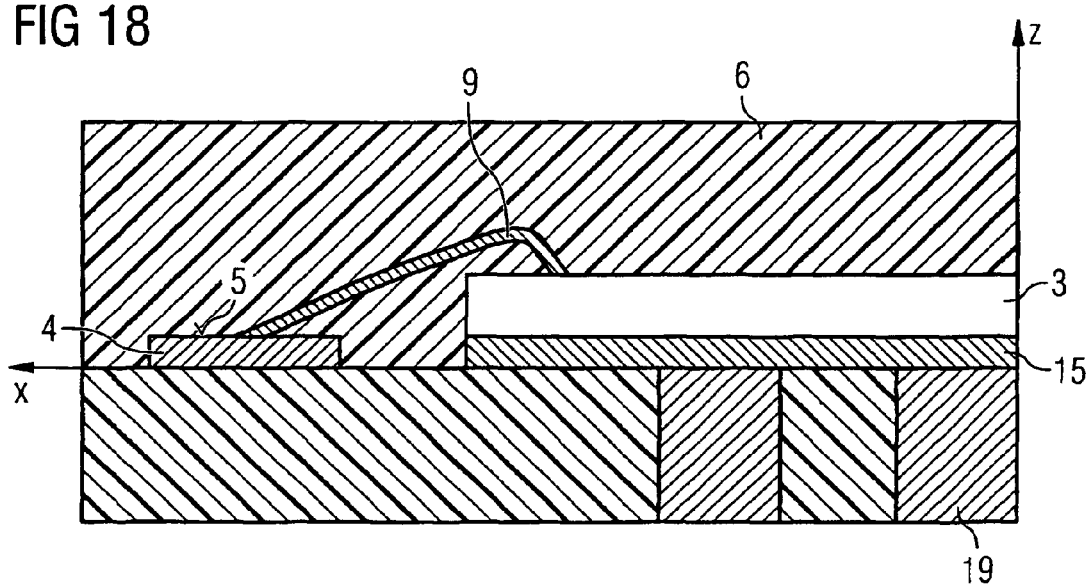

FIG. 18 illustrates a cross section through the radio-frequency component 1 as shown in FIG. 17.

Figure 19:
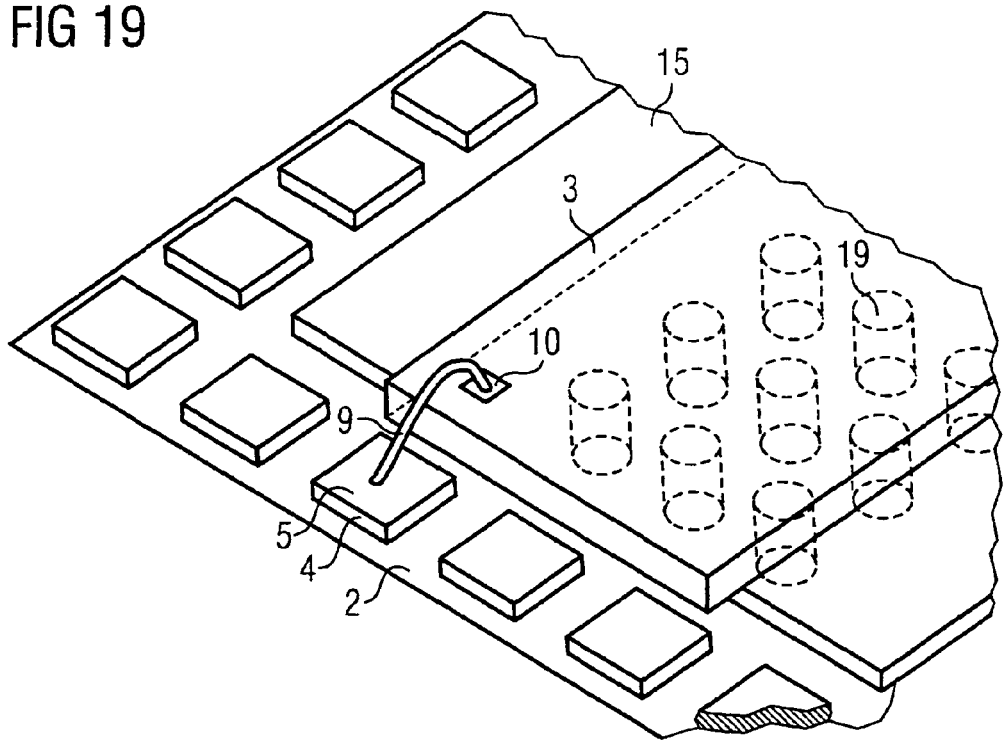
FIGS. 19 and 20 illustrate an isometric illustration and a side view, respectively, of the model of a semiconductor component according to the third embodiment.

FIG. 19 illustrates an isometric illustration of a radio-frequency component 1 according to the third embodiment. In this case, the chip 3 projects over the side edge 17 of the die pad 15.

Figure 20:
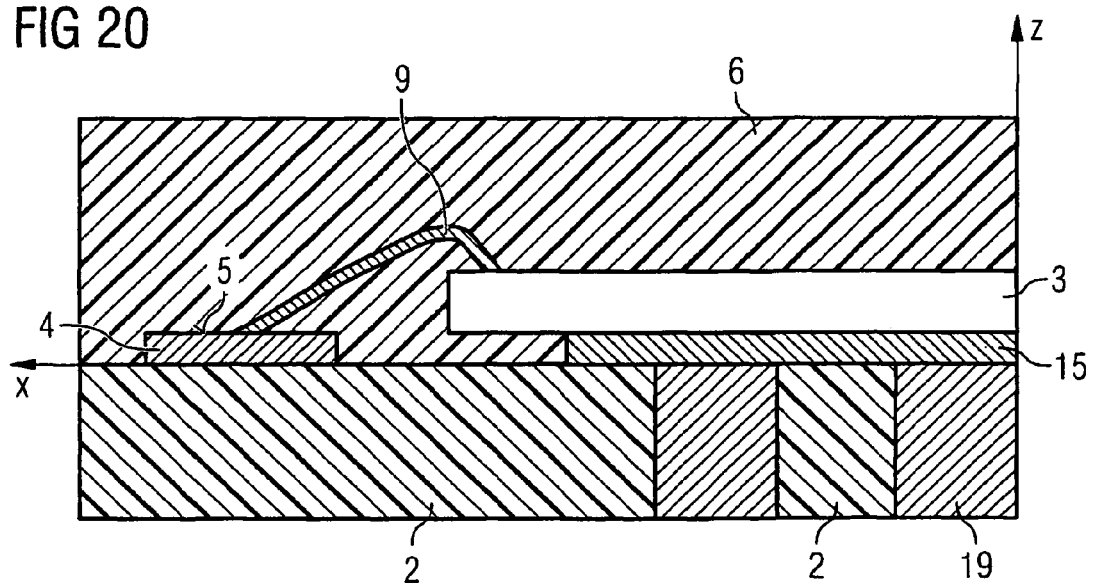

FIG. 20 illustrates the corresponding cross-sectional illustration of the radio-frequency semiconductor component 1 as shown in FIG. 19.

Figure 21:
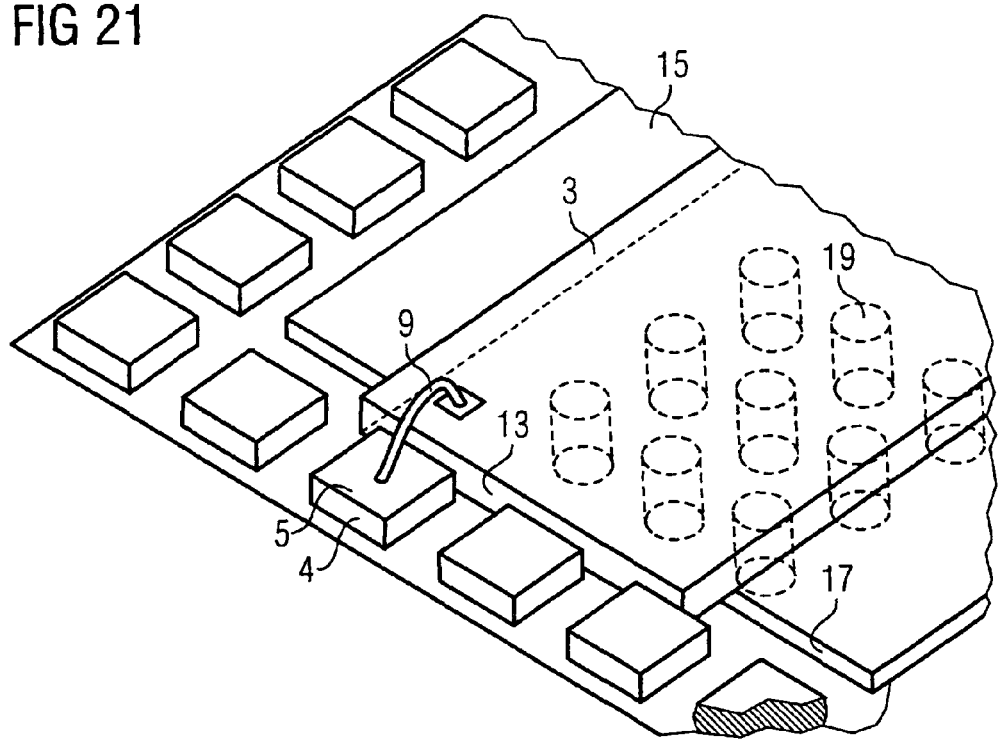
FIGS. 21 and 22 illustrate an isometric illustration and a side view, respectively, of a model of a semiconductor component according to the fourth embodiment.

FIG. 21 illustrates an isometric illustration of a radio-frequency semiconductor component according to the fourth embodiment. In this case, the contact pads 10 and the contact connecting pads 5 are located at the same height. The height of the die pad is 10 μm, while the contact connections 4 are 100 μm high.

Figure 22:
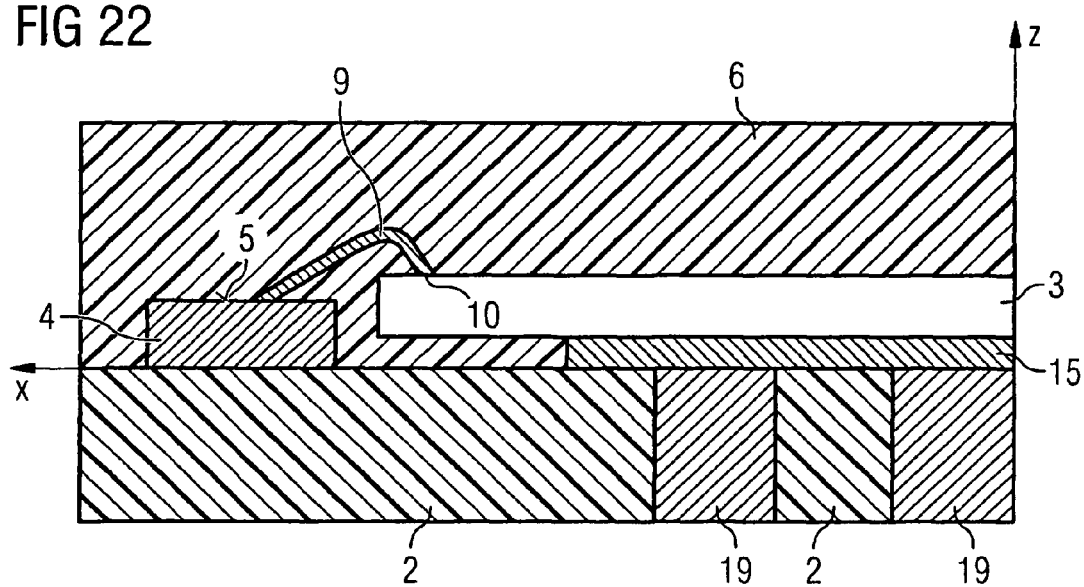

FIG. 22 illustrates a cross-sectional illustration corresponding to FIG. 21.

Figure 23:
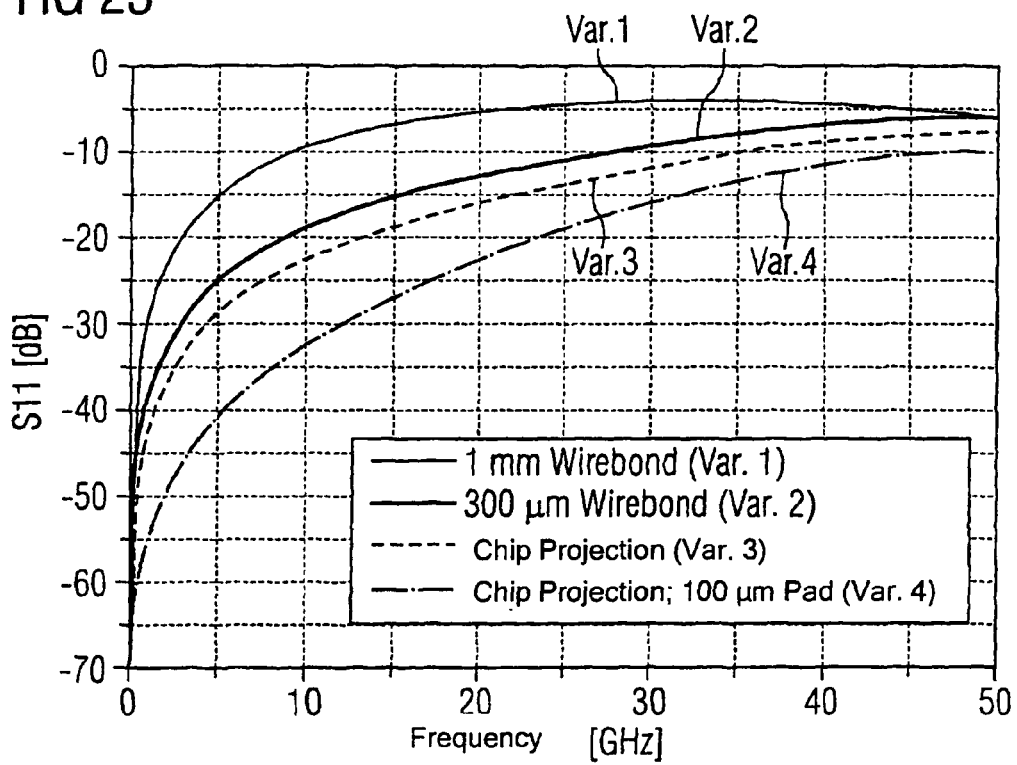
FIGS. 23 to 25 illustrate the simulation results for S-parameters of the bonding wires based on the models shown in FIGS. 15 to 22.

In the graph in FIG. 23, the magnitude of the simulated scatter parameter for the reflection, $S_{11}$, is plotted in dB against the frequency in GHz. Variant 1 of the four curves corresponds to the radio-frequency semiconductor component illustrated in FIGS. 15 and 16, variant 2 corresponds to the radio-frequency semiconductor component illustrated in FIGS. 17 and 18, variant 3 corresponds to the radio-frequency component shown in FIGS. 19 and 20, and variant 4 corresponds to the radio-frequency component shown in FIGS. 21 and 22. In variant 1, the bonding wire 9 has a length of 1 mm, while its length in variant 2 is 300 μm.

At low frequencies, the scatter parameter $S_{11}$ is very small, and increases at higher frequencies. Maximum values of about −4 dB at about 35 GHz are in this case determined for variant 1, while the value remains less than about −6 dB up to a frequency of 50 GHz for variants 2 to 4. In this case, the lowest values of $S_{11}$ are obtained for all frequencies, and thus the smallest backward wave for reflection-free termination, for variant 4, followed by variant 3 and variant 2.

Figure 24:
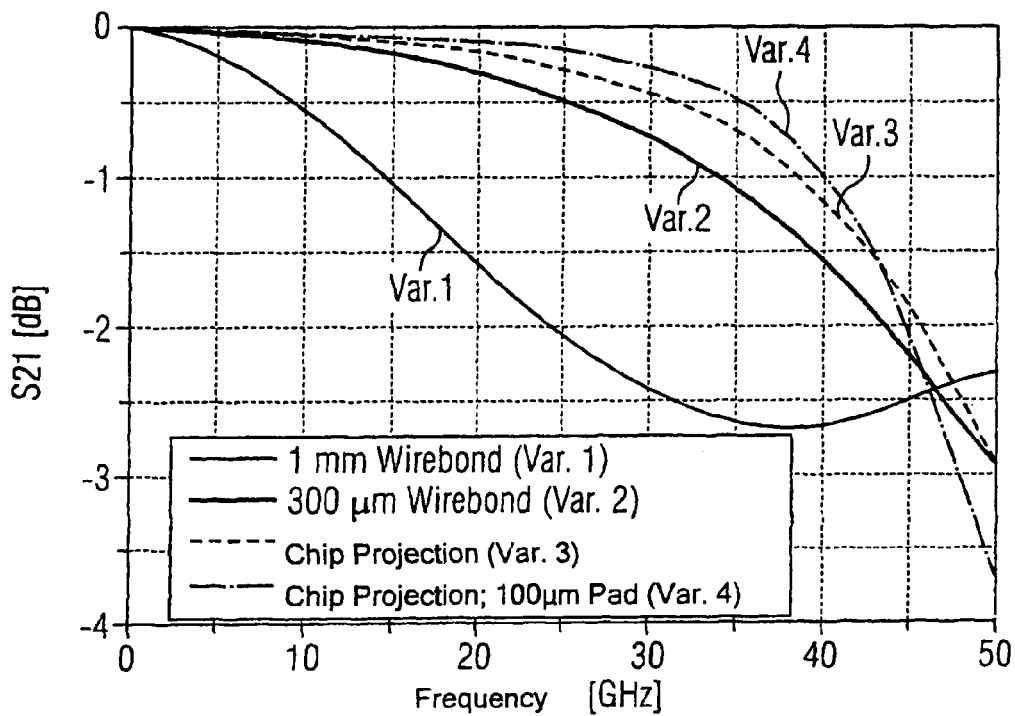

FIG. 24 illustrates the magnitude of the scatter parameter $S_{21}$ which was determined in the same simulation as the results in FIG. 23. $S_{21}$ is likewise plotted against the frequency for the four variants. $S_{21}$ is 0 dB=1 at the frequency 0 GHz for all variants, that is to say the transmission is optimum. At higher frequencies, the values for the transmission $S_{21}$ fall, depending on the variant, to values between −2.3 to −3.6 at 50 GHz. As can be seen, the variant has poorer values for $S_{21}$ at frequencies up to about 47 GHz. However, at higher frequencies, variant 1 has better transmission characteristics.

Figure 25:
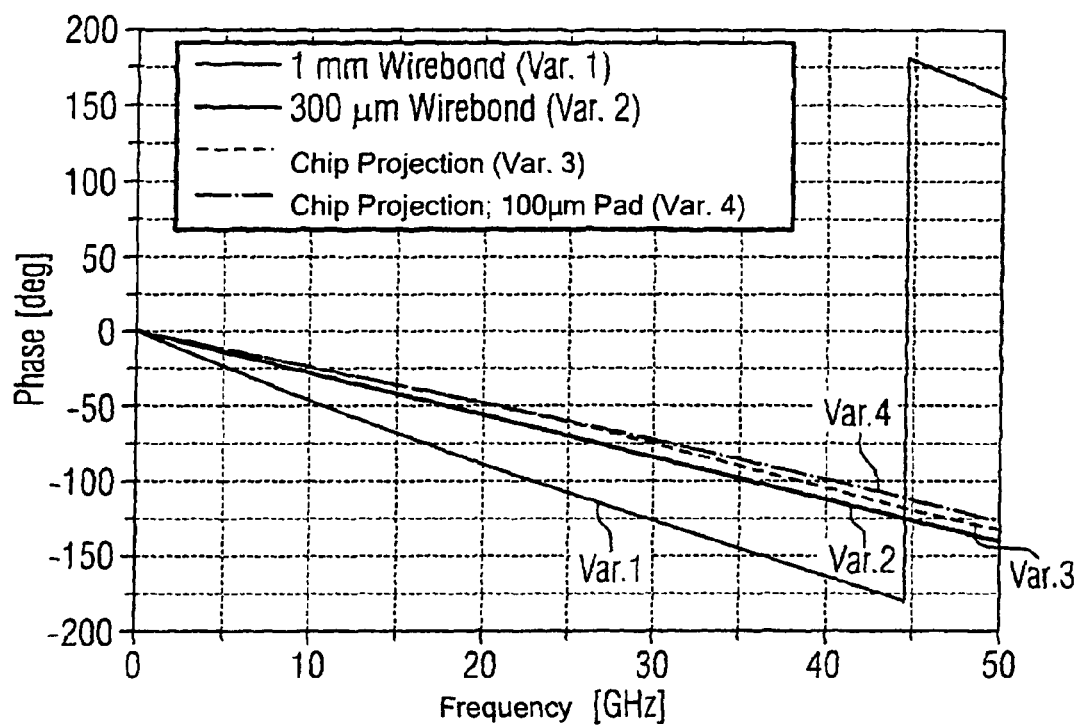

FIG. 25 illustrates the phase response of the scatter parameter $S_{21}$, whose magnitude is plotted in FIG. 24. The phase falls in variant 1 from 0° at 0 GHz to about −200°, with the values of less than −180° in the diagram being shown in the angle range of the values of less than 180°.

For variants 2, 3 and 4, the phase profile is approximately linear from 0° up to values between −125° and 140°.

Figure 26:
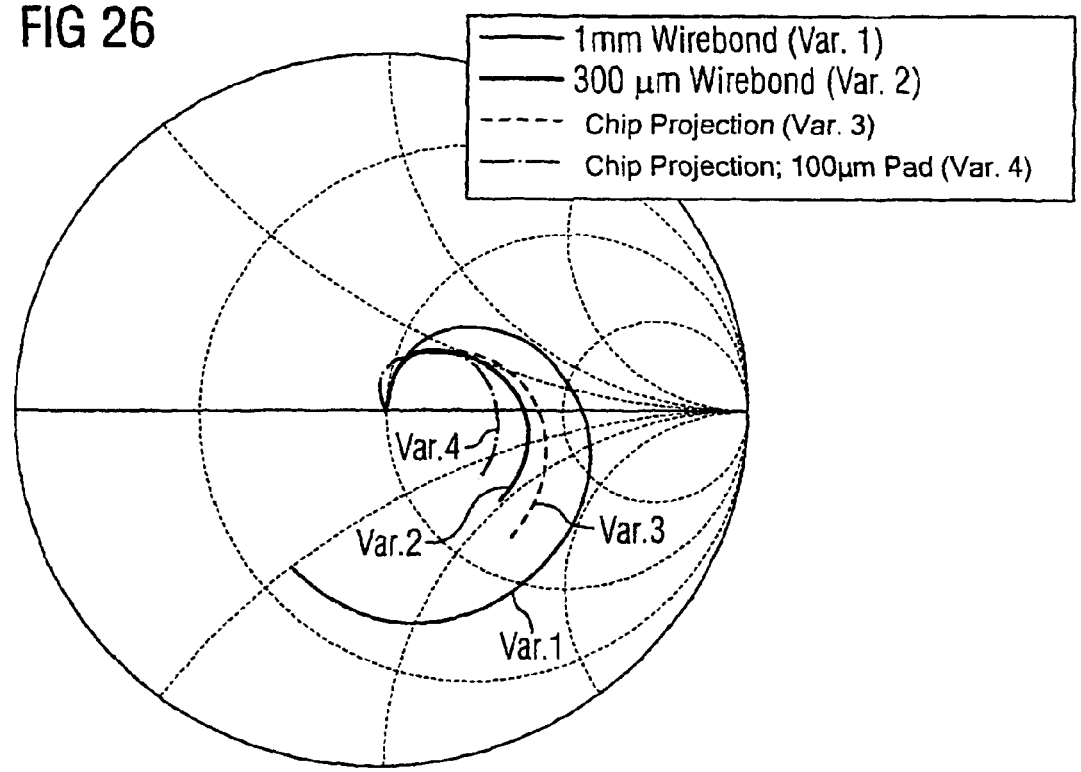
FIGS. 26 and 27 are Smith diagrams for the measurement results illustrated in FIGS. 23 to 25.
Figure 27:
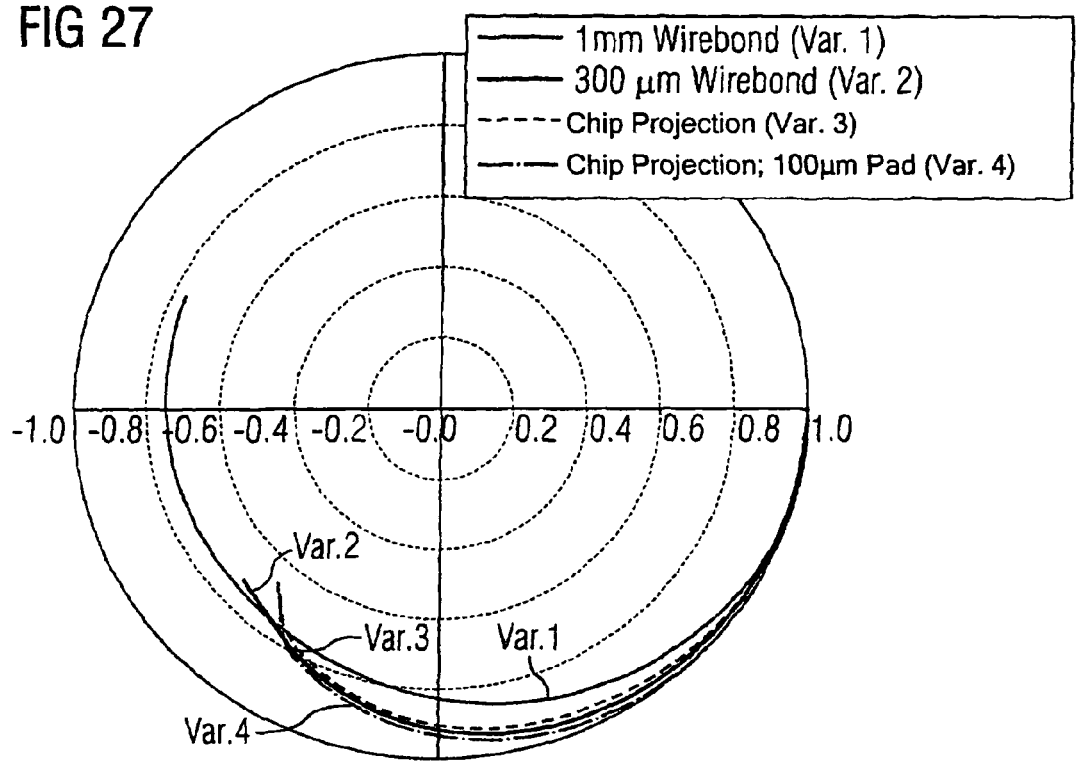

FIG. 26 illustrates the scatter parameter for the reflection $S_{11}$ in the form of a Smith diagram, while FIG. 27 illustrates the scatter parameter for the transmission $S_{21}$ in the form of a Smith diagram.

It remains to be stated that variants 2, 3 and 4 according to the invention have major advantages in terms of reflection, particularly at high frequencies, since the reflection is less than in the case of the conventional component according to variant 1. The best variant in terms of reflection is variant 4, in which the chip 3 projects and the contact pads and contact connecting pads are located at the same height.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component for radio-frequency applications comprising:
   at least one chip, with contact pads;
   a substrate,
   a die pad on the substrate;
   contact connections with contact connecting pads on the substrate, the die pad positioned between the contact connections; and
   bonding wires, which connect the contact pads on the chip to the contact connecting pads;
   in which signals at high frequencies are passed via a first set of one or more contact pads, and signals at low frequencies are passed via a second set of one or more contact pads, with the high frequencies being at least 1.5 times as high as the low frequencies; and
   wherein the chip is mounted at on off-center position on the die pad so as to be arranged between the contact connecting pads on the substrate such that the chip is shifted from a central position with respect to the totality of the contact connecting pads so that the bonding wires for the contact pads of the first set are shorter than the bonding wires for the contact pads of the second set.

2. The semiconductor component as claimed in claim 1, comprising wherein the contact connecting pads are higher than the height of the die pad.

3. The semiconductor component as claimed in claim 1, comprising wherein the contact connections on their upper face are coated with an electrochemically deposited layer.

4. The semiconductor component as claimed in claim 1, wherein the high frequencies are at least 2.5 times as high as the low frequencies.

5. A semiconductor component for radio-frequency applications comprising:
   at least one chip with an upper face and a rear face, and with contact pads on the upper face;
   a substrate on which a die pad is fitted, wherein the chip is fitted with its rear face on the die pad;
   contact connections with contact connecting pads on their upper face, with the contact connections being fitted on the substrate, the die pad positioned between the contact connecting pads;
   bonding wires, which connect the contact pads on the chip to the contact connecting pads;
   in which signals at high frequencies are passed via a first set of one or more contact pads, and signals at low frequencies are passed via a second set of one or more contact pads, with the high frequencies being at least 1.5 times as high as the low frequencies; and
   wherein the chip is arranged at an off-center position on the die pad such that the chip is shifted from a central position with respect to the totality of the contact connecting pads so that the bonding wires for the contact pads of the first set are shorter than the bonding wires for the contact pads of the second set.

6. The semiconductor component as claimed in claim 5, comprising wherein the die pad is no higher than 60 μm.

7. The semiconductor component as claimed in claim 5, comprising wherein the contact connecting pads are higher than the height of the die pad.

8. The semiconductor component as claimed in claim 5, comprising wherein the contact connecting pads are located at the same height as the contact pads on the chip.

9. The semiconductor component as claimed claim 5, comprising wherein one face of the chip ends flush with the die pad which is located under it.

10. The semiconductor component as claimed in claim 5, comprising wherein the chip projects over one side edge of the die pad.

11. The semiconductor component as claimed in claim 5, comprising wherein the chip rests directly on the substrate.

12. The semiconductor component as claimed in claim 11, comprising wherein the substrate has a copper plate, on which the chip is soldered, at least on its upper face.

13. The semiconductor component as claimed in claim 5, comprising wherein the contact connections on their upper face are coated with an electrochemically deposited layer.

14. The semiconductor component as claimed in claim 5, wherein the high frequencies are at least 2.5 times as high as the low frequencies.

15. The semiconductor component as claimed in claim 5, comprising wherein the high frequencies are at least 3.5 times as high as the low frequencies.

16. The semiconductor component as claimed in claim 5, wherein at least the high frequencies are in the Gigahertz range.

17. The semiconductor component as claimed claim 5, wherein the high frequencies are higher than 70 GHz, and the low frequencies are lower than or equal to 20 GHz.

18. The semiconductor component as claimed in claim 5, comprising wherein the semiconductor component contains a 77 GHz oscillator for a radar.

19. The semiconductor component as claimed in claim 5, comprising wherein the semiconductor component contains a P-TSLP housing.

20. The semiconductor component as claimed in claim 5, comprising wherein the distance between the chip and at least one of the contact connections is less than 150 μm.

21. A semiconductor component for radio-frequency applications comprising:
   at least one chip with an upper face and a rear face, and with contact pads on the upper face;
   a substrate on which a die pad is fitter, wherein the chip is fitted with its rear face on the die pad;

contact connections with contact connecting pads on their upper face, with the contact connections being fitted on the substrate, the die pad positioned between the contact connecting pads;

bonding wires, which connect the contact pads on the chip to the contact connecting pads;

in which signals at high frequencies are passed via a first set of one or more contact pads, and signals at low frequencies are passed via a second set of one or more contact pads, with the high frequencies being at least 1.5 times as high as the low frequencies; and wherein the chip is mounted at an off-center position on the die pad such that the chip is shifted from a central position with respect to the totality of the contact connecting pads so that the bonding wires for the contact pads of the first set are shorter than the bonding wires for the contact pads of the second set.

* * * * *

UNITED STATES PATENT AND TRADEMARK OFFICE
CERTIFICATE OF CORRECTION

| | | |
|---|---|---|
| PATENT NO. | : 7,838,989 B2 | Page 1 of 1 |
| APPLICATION NO. | : 11/635827 | |
| DATED | : November 23, 2010 | |
| INVENTOR(S) | : Dangelmaier et al. | |

It is certified that error appears in the above-identified patent and that said Letters Patent is hereby corrected as shown below:

Column 10, line 26, delete "claimed claim" and insert in place thereof --claimed in claim--.

Column 10, line 66, delete "fitter" and insert in place thereof --fitted--.

Signed and Sealed this
Twenty-sixth Day of April, 2011

David J. Kappos
*Director of the United States Patent and Trademark Office*